(12) United States Patent
Bechtel et al.

(10) Patent No.: US 7,952,270 B2
(45) Date of Patent: May 31, 2011

(54) ELECTROLUMINESCENT DEVICE

(75) Inventors: Hans-Helmut Bechtel, Roetgen (DE); Wolfgang Busselt, Roetgen (DE); Peter J. Schmidt, Aachen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 291 days.

(21) Appl. No.: 11/995,385

(22) PCT Filed: Jul. 4, 2006

(86) PCT No.: PCT/IB2006/052251
§ 371 (c)(1),
(2), (4) Date: Jan. 11, 2008

(87) PCT Pub. No.: WO2007/007236
PCT Pub. Date: Jan. 18, 2007

(65) Prior Publication Data
US 2008/0211387 A1  Sep. 4, 2008

(30) Foreign Application Priority Data
Jul. 14, 2005  (EP) ..................... 05106451

(51) Int. Cl.
H01L 51/00 (2006.01)
(52) U.S. Cl. .................... 313/504; 313/506

(58) Field of Classification Search .......... 313/498–512
See application file for complete search history.

(56) References Cited

U.S. PATENT DOCUMENTS

| 5,091,653 A * | 2/1992 | Creager et al. ............. 250/484.5 |
| 5,255,171 A * | 10/1993 | Clark ............................ 362/231 |
| 6,417,019 B1 | 7/2002 | Mueller et al. |
| 6,734,465 B1 | 5/2004 | Taskar et al. |
| 6,870,311 B2 * | 3/2005 | Mueller et al. ................ 313/491 |
| 2003/0111955 A1 | 6/2003 | McNulty et al. |
| 2004/0144987 A1 | 7/2004 | Ouderkirk et al. |
| 2004/0150991 A1 * | 8/2004 | Ouderkirk et al. ............ 362/231 |
| 2004/0201987 A1 | 10/2004 | Omata |

FOREIGN PATENT DOCUMENTS

| EP | 1081771 A2 | 3/2001 |
| JP | 2003243717 | 8/2003 |
| WO | 2005103199 | 11/2005 |

* cited by examiner

Primary Examiner — Anne M Hines

(57) ABSTRACT

An electroluminescent device comprising at least one electroluminescent light source (2) with an electroluminescent layer (21) for emitting a primary radiation with an emission characteristic around a mean emission direction (5), and at least one light-converting element (3) for converting at least part of the primary radiation into a secondary radiation, wherein the shape of the light-converting element (3) is adapted to the emission characteristic of the electroluminescent light source (2) so as to generate a defined correlated color temperature as a function of a viewing angle (10).

14 Claims, 3 Drawing Sheets

ELECTROLUMINESCENT DEVICE

This invention relates to a phosphor-converted electroluminescent device with a correlated color temperature adapted to the application as a function of the viewing angle, and to a method for adapting the color temperature.

Phosphor-converted electroluminescent devices (pcLEDs) comprising an electroluminescent light source (LED) and a light-converting phosphor powder layer are known. In such pcLEDs, the LED emits a primary radiation, part of which is absorbed by a phosphor powder layer arranged on the LED and re-emitted as longer-wavelength secondary radiation. This process is also referred to as color conversion or light conversion. With a suitable combination of primary and secondary radiation, it is possible for example for white light to be generated by means of additive color mixing of blue primary radiation and yellow secondary radiation. Important parameters for pcLEDs are the so-called package gain (efficiency of light conversion and extraction) and the ratio between the intensities of the primary and secondary radiation for setting the mixed color for the LED as a whole. Package gain is understood to mean the ratio of emitted photons between a pcLED with a phosphor layer and a pcLED without a phosphor layer. The best pcLEDs available at present have a package gain of less than 50%.

Document U.S. Pat. No. 6,417,019 discloses pcLEDs with phosphor powder layers which contain phosphor particles of different sizes. Depending on the particle size and the condition of the material, a distinction is made between phosphor powder layers with high optical scattering (referred to as a phosphor layer) and phosphor powder layers with low optical scattering (referred to as a phosphor film). An LED may be arranged at the bottom of a bowl filled with phosphor powder material or be coated with a phosphor layer with a homogeneous thickness. In the case of phosphor layers, the concentration and nature of the phosphor particles which are embedded in a matrix determine the integral proportion of primary radiation which is converted into secondary radiation. Phosphor films are applied to an LED as ceramic layers with a homogeneous thickness, which essentially contain only phosphor particle material, wherein here the thickness of the phosphor films and their scattering ability determines the proportion of primary radiation which is converted into secondary radiation. Moreover, the scattering ability of the phosphor layer determines the extent to which the angle distribution of the primary radiation of the light source determines the cosine distribution of the secondary radiation of the phosphor layer. Since current LEDs have an angle distribution which differs considerably from a cosine distribution, phosphor layers with a high scattering ability are used, but this also reduces the package gain of the light source. Different embodiments of the phosphor film serve only to set an integral correlated color temperature. The color temperature averaged over all the viewing angles is referred to as the integral correlated color temperature.

The term correlated color temperature is used when the colorfulness of a selective emitter is not the same as the colorfulness of a black body emitter. The so-called correlated color temperature then refers to the temperature of that black body emitter whose perceived color is most similar to the given emitter. A corresponding correlated color temperature can be determined for all values of the CIE color diagram.

Nevertheless, by way of example, white pcLED light sources with an integrated correlated color temperature exhibit a variation in the correlated color temperature over the viewing angle of up to 2000 K, which can be easily perceived by the viewer. There are many requirements with regard to the homogeneity or variation in the correlated color temperature as a function of the viewing angle. On the one hand, for many applications, for example indicator lights, as little variation as possible in the correlated color temperature over the viewing angle is desirable. On the other hand, applications with special light effects may for example require a defined inhomogeneity of the correlated color temperature over the viewing angle. The prior art does not give the person skilled in the art any indication as to how a desired function $FT(\beta)$ of the correlated color temperature $FT$ with respect to the viewing angle $\beta$ can be set in a targeted manner.

It is therefore an object of the present invention to provide a phosphor-converted electroluminescent device which is characterized by a variation in the correlated color temperature over the viewing angle which is adapted to the application.

This object is achieved by an electroluminescent device comprising at least one electroluminescent light source with an electroluminescent layer for emitting a primary radiation with an emission characteristic around a mean emission direction, and at least one light-converting element for converting at least part of the primary radiation into a secondary radiation, wherein the shape of the light-converting element is adapted to the emission characteristic of the electroluminescent light source so as to generate a defined correlated color temperature as a function of a viewing angle. The emission characteristic here refers to the distribution of the propagation directions of the primary radiation around a mean emission direction.

In one embodiment of the electroluminescent device, the light-converting element is optically connected to the electroluminescent light source. This connection of the light source to the light-converting element allows an approximately isotropic emission characteristic through the connection material and as a result allows easier adaptation of the angle dependence of the color temperature than is possible with non-connected light sources having what is approximately a Lambert's emission characteristic. Lambert light sources are light sources with a cosine emission characteristic.

In another embodiment, the light-converting element comprises a ceramic material and/or a dimensionally stable matrix material with embedded light-converting particles. Here, dimensionally stable is understood to mean a geometric shape which remains intact under operating conditions and over the operating time. Ceramic materials provide this property per se.

In another embodiment of an electroluminescent device comprising a light-converting element made of ceramic material, the ceramic material has a density greater than 97% of the theoretical solid density. On account of the high density, the scattering of light within the light-converting element is reduced, as a result of which the primary/secondary radiation proportion can be adjusted independently of the scattered proportion, and this has an effect on the angle distribution of the color temperature.

In another embodiment, the shape of the light-converting element comprises a first surface which faces toward the electroluminescent light source, a second surface which faces away from the electroluminescent light source, and an edge surface which is arranged between the first and second surface.

In another embodiment, the shape of the light-converting element is a shape from the group consisting of sheet-like shapes, disk-like shapes and/or bowl-like shapes. Here, sheet-like refers to a shape whose average size in two spatial directions is much larger than the size of the third spatial direction which is orthogonal to the other spatial directions. A disk-like shape refers to a shape whose first and second surfaces are arranged essentially parallel to one another. A bowl-like shape refers to a shape which surrounds all the emitting sides of the electroluminescent light source.

In another embodiment of the electroluminescent device, the edge surface is arranged at an angle to the layer normal of the electroluminescent layer of the electroluminescent light source, which is adapted so as to generate a defined correlated color temperature. A layer normal is to be understood to mean a vector which stands in a perpendicular manner on the corresponding layer. The correlated color temperature in the case of large viewing angles can be set by means of the angle of the edge surface to the layer normal of the electroluminescent layer. In one preferred embodiment, the angle is between 20° and 70°. In this angle range for the edge surfaces, color temperatures which are largely independent of the viewing angle can be achieved.

In another embodiment, the electroluminescent layer protrudes beyond the light-converting element by an excess length $U_{EL}$ parallel to the first surface of the light-converting element. In another embodiment, the light-converting element protrudes beyond the electroluminescent layer by an excess length $U_{LKE}$ parallel to the electroluminescent layer of the electroluminescent light source. By virtue of an excess length, the intensity of the primary radiation from the side regions of the electroluminescent light source can be varied for large viewing angles, and thus the color temperature can be set relative to the color temperature in the case of small viewing angles.

In another embodiment, the excess length $U_{LKE}$ is equal to or greater than the distance between the electroluminescent layer and the first surface of the light-converting element. By virtue of this excess length, the color temperature for large and small viewing angles is equalized.

In another embodiment, between the first and second surface of the light-converting element, there is a first spacing and a second spacing which is less than or equal to four times the first spacing. By virtue of these differences in spacing, the correlated color temperature in the edge region can also be set for light beams having a propagation direction along the mean emission direction, by means of increased or reduced absorption of the primary radiation.

In another embodiment, at least one surface from the group consisting of first surface, second surface and edge surface has a refractive structure. By virtue of this structure, both the coupling-in of light from the electroluminescent light source into the light-converting element and the coupling-out of light from the light-converting element can be improved. Moreover, the refractive structure has an effect on the light distribution of primary and secondary radiation and thus on the color temperature as a function of the viewing angle.

In another embodiment, the light-converting element reflects less than 20% of the primary radiation. As a result, the scattering behavior of the light-converting element is reduced and therefore allows better adjustability of variations in the correlated color temperature for certain viewing angle ranges. In addition, a better transmission capability leads to a higher package gain.

Furthermore, the invention relates to a method for producing an electroluminescent device as claimed in claim 1, comprising the steps:
 defining a desired correlated color temperature as a function of a viewing angle,
 determining the emission characteristic of the electroluminescent light source without a light-converting element,
 adapting the light-converting element to the emission characteristic of the electroluminescent light source so as to generate the defined correlated color temperature as a function of the viewing angle.

The invention will be further described with reference to examples of embodiments shown in the drawings to which, however, the invention is not restricted.

Figure 1:
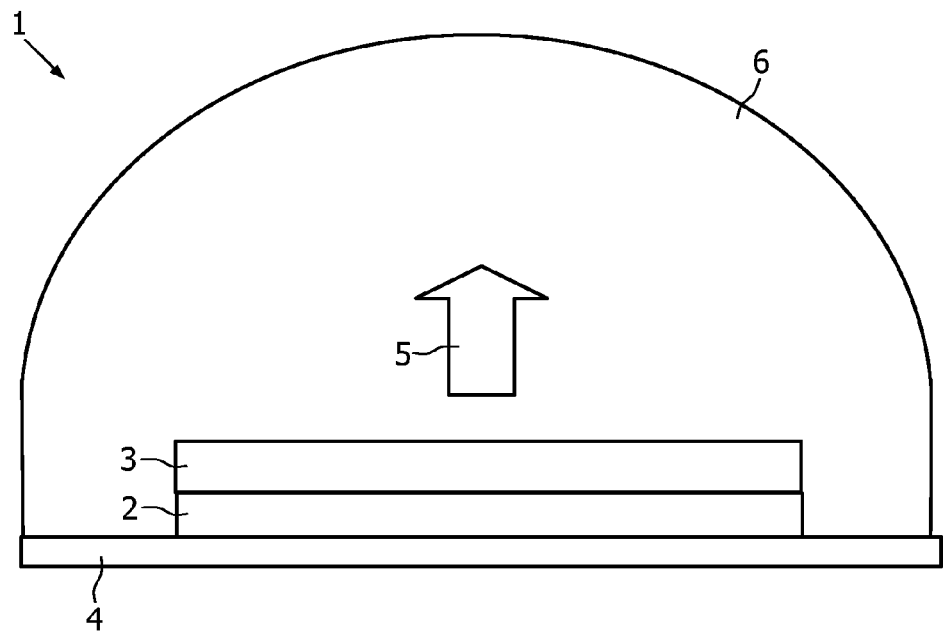
FIG. 1 shows an electroluminescent device according to the prior art.

FIG. 1 shows an electroluminescent device 1 according to the prior art, comprising an electroluminescent light source 2 applied to a base 4 for emitting a primary radiation with an emission characteristic around a mean emission direction 5, and a light-converting element 3 arranged in the beam path of the primary radiation for at least partially absorbing the primary radiation and emitting a secondary radiation. The electroluminescent light source 2 emits a mixed light consisting of primary and secondary radiation with a resulting correlated color temperature. The electroluminescent light source 2 and the light-converting element 3 applied to the electroluminescent light source 2 are typically surrounded by a lens 6 made of a transparent material, which has an outer concave surface as seen in the light emission direction 5.

An electroluminescent light source 2 as shown in FIG. 1 comprises a substrate, for example sapphire, and an electroluminescent layer structure applied to the substrate, said layer structure comprising at least one organic or non-organic electroluminescent layer which is arranged between two electrodes. Usually, the substrate is transparent to both primary and secondary radiation. Typically, the electrode which faces toward the substrate is transparent, so that the primary radiation is emitted through the substrate. Accordingly, the electrode on the side facing away from the substrate is reflective (bottom emitter). In other embodiments, it is also possible for the primary radiation to be emitted not through the substrate but rather through a transparent electrode on the side facing away from the substrate (top emitter). The electroluminescent device 1 may also comprise a number of electroluminescent light sources 2 for emitting identical and/or different primary radiation. The light-converting element 3 is arranged in the beam path of the primary radiation so as to at least partially absorb primary radiation. In this case, it may be applied directly to the electroluminescent light source 2 or be optically connected to the electroluminescent light source 2 by means of transparent materials. In order to optically connect the light-converting element 3 to the electroluminescent light source 2, use may be made, for example, between the light-converting element 3 and the electroluminescent light source 2, of adhesion layers made of elastic or hard materials with a refractive index for the primary radiation of between 1.4 and 3.0, for example crosslinkable two-component silicone rubbers crosslinked with platinum or else glass materials which at high temperatures are joined to the light source and to the light-converting element. Moreover, it is particularly advantageous if the light-converting element 3 is brought into close contact with the electroluminescent light source 2, so that the distance between the two is on average less than 30 times the average wavelength of the primary radiation, preferably 10 times, particularly preferably less than 3 times the average wavelength. In other embodiments, however, it is also possible for a number of light-converting elements which differ in terms of their arrangement, size, geometry or material to be optically connected to one or more electroluminescent light sources.

In the case of non-connected light-converting elements 3, the primary radiation reaches the light-converting element 3 with what is approximately a Lambert's angle distribution (distribution of the propagation angle relative to the mean emission direction 5). If the light-converting element is optically connected to the electroluminescent light source 2, the angle distribution of the primary radiation approximates an isotropic angle distribution, depending on the refractive index of the optical connection. Moreover, the angle distribution of the electroluminescent light source is to a great extent determined by the layer structure of the various active layers of the light source itself.

Unlike the light-converting element 3 in FIG. 1, the light-converting element according to the invention has a shape which is adapted to the correlated color temperature desired for a viewing angle. In order to be able to carry out suitable adaptation, the emission characteristic of the electroluminescent light source 2 must be determined beforehand (without the light-converting element 3). To this end, the intensity of the primary radiation of the electroluminescent light source is measured in an angle-dependent manner without the light-converting element. Care should be taken here to ensure that the angle dependence is measured in the material/medium which is used to optically connect the light-converting element. The proportion of primary radiation in the mixed light can then be increased or reduced by virtue of the adapted shape of the light-converting element, depending on the desired angle dependence of the correlated color temperature.

Figure 2:
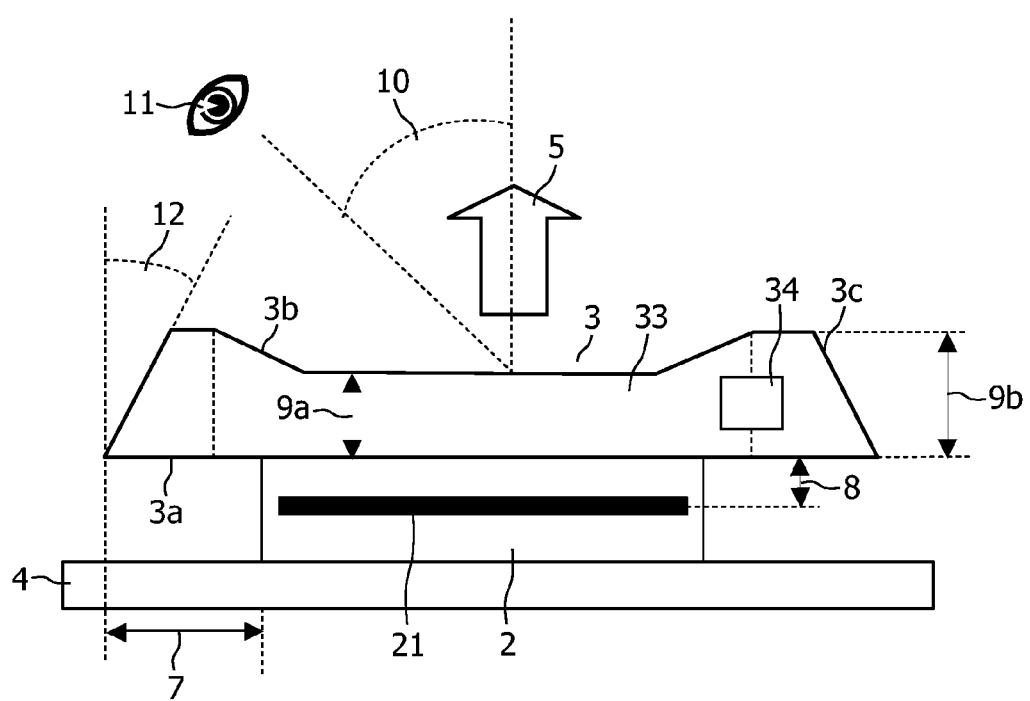
FIG. 2 shows another embodiment of an electroluminescent device according to the invention.

FIG. 2 shows an example of embodiment of an electroluminescent device 1 according to the invention with a disk-shaped light-converting element 3. The light-converting element 3 may in this case comprise for example a pressed ceramic made of essentially light-converting phosphor material or a dimensionally stable matrix material, for example PMMA or other materials which can be doped with particles, comprising embedded light-converting particles. Here, the geometric shape of the light-converting element 3 is adapted so as to set the desired dependence of the correlated color temperature of the mixed light on the viewing angle 10 at which a viewer 11 views the electroluminescent device 1. The disk-like shape which is shown by way of example in FIG. 2 comprises a first and second surface 3a and 3b and an edge surface 3c. A disk-like shape is a shape whose first and second surfaces 3a and 3b are arranged essentially parallel to one another. The light-converting element 3 is arranged at a distance 8 between the first surface 3a of the light-converting element 3 and the electroluminescent layer 21. The light-converting element 3 may however also have other shapes, such as sheet-like, curved or bowl-like shapes for example, depending on the use conditions and regardless of the material of the light-converting element 3. Here, sheet-like refers to a shape whose average size in two spatial direction is much greater than the size of the third spatial direction which is orthogonal to the other spatial directions. In this case, the sheet-like shape may be embodied as a sheet which is curved or uneven in the third dimension. A bowl-like shape refers to a shape which surrounds all the emitting sides of the electroluminescent light source 2.

One parameter for adapting the correlated color temperature in the case of large viewing angles is the relative excess length $U_{EL}$ or $U_{LKE}$ of the light-converting element 3 parallel to the electroluminescent layer 21. If the electroluminescent light source 2 protrudes beyond the light-converting element 3, the excess length is denoted $U_{EL}$. If the light-converting element 3 protrudes beyond the electroluminescent light source 2, the excess length 7 by which the light-converting element 3 protrudes beyond the electroluminescent light source 2 parallel to the electroluminescent layer 21 is denoted $U_{LKE}$.

Another parameter for adapting the color temperature over the viewing angle 10 is the spacing (or else thickness) between the first and second surface 3a and 3b of the light-converting element 3. In the case of light-converting elements 3 with a first spacing 9a in a region 33 and a second spacing 9b in a region 34, the color temperature can be set for specific regions of the viewing angle independently of one another.

Another parameter for adapting the color temperature over the viewing angle 10 is the angle 12 of the edge surface 3c of the light-converting element 3 to the layer normal of the electroluminescent layer 21 of the electroluminescent light source 2.

Figure 3:
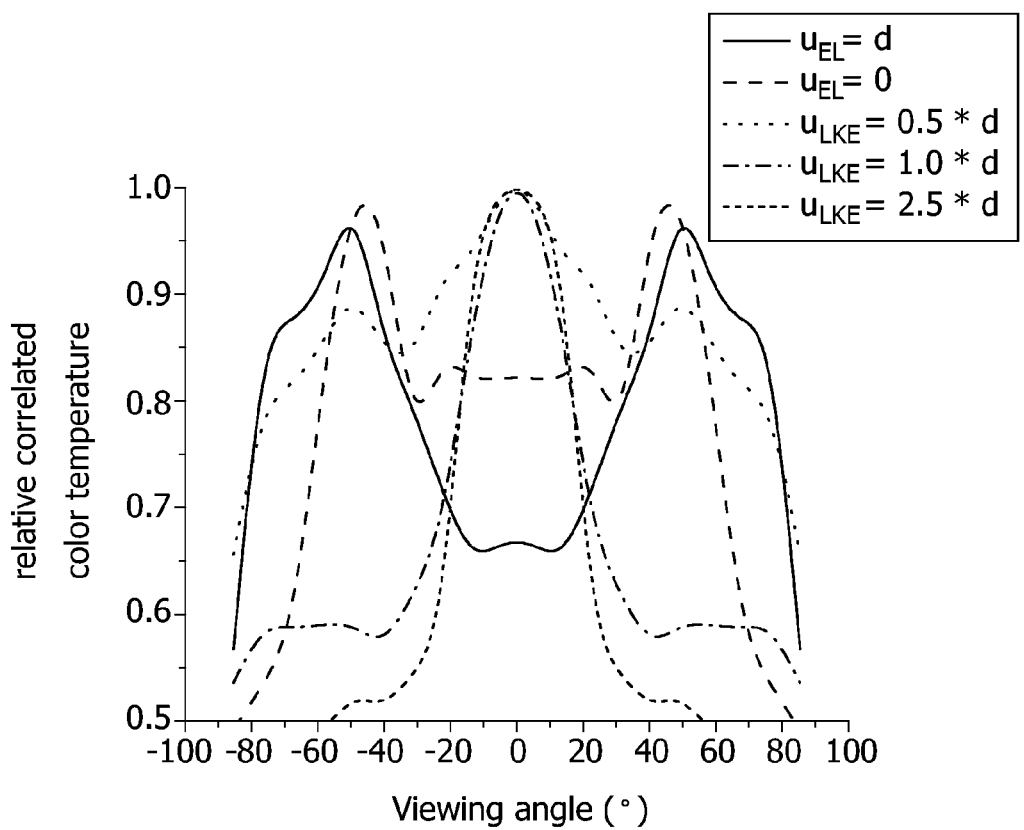
FIG. 3 shows the variation in the correlated color temperature as a function of the viewing angle for various excess lengths $U_{EL}$ and $U_{LKE}$.

FIG. 3 shows the variation in the color temperature as a function of the viewing angle 10 for various excess lengths $U_{LKE}$ and $U_{EL}$ using the example of a disk-shaped light-converting element 3 which is optically connected to the electroluminescent light source 2, said light-converting element 3 having a homogeneous thickness (first spacings 9a=second spacings 9b) and an edge surface 3c which is arranged parallel to the layer normal of the electroluminescent layer (which corresponds here to the emission direction 5). The excess lengths $U_{EL}$ and $U_{LKE}$ are in this case given as a multiple of the distance 8, denoted parameter d in the legend of FIG. 3, between the first surface 3a of the light-converting element 3 and the electroluminescent layer 21. The variation in the color temperature between small and large viewing angles is particularly great for large excess lengths 7, since the proportions of primary radiation having a propagation direction at large angles to the mean emission direction 5 absorbs to a greater extent in the light-converting element 3 on account of the longer light path. This applies in particular to primary radiation which exits from the side of the electroluminescent light source 2. Given such a shape of the light-converting element 3, at large viewing angles 10 the color temperature corresponds more and more to the color temperature of the pure secondary radiation as the value of $U_{LKE}$ increases. For very small excess lengths $U_{LKE}$ relative to the distance 8 between the first surface 3a of the light-converting element 3 and the electroluminescent layer 21 or excess lengths $U_{EL}$ where the electroluminescent layer protrudes beyond the light-converting element, an inverted relative ratio of primary and secondary radiation is obtained.

The curves of the correlated color temperature from small to large viewing angles 10 can additionally be adjusted by means of the angle 12 of the edge surface 3c to the layer normal of the electroluminescent layer 21 of the electroluminescent light source 2. For large angles 12, a proportion of primary radiation which increases with the viewing angle over a large angle range of the viewing angle 10 is obtained in the mixed light emitted for this viewing angle. In the case of small or negative angles 12, the proportion of primary radiation for large viewing angles 10 may on the other hand even be smaller than in the case of perpendicular viewing of the electroluminescent device 1.

Figure 4:
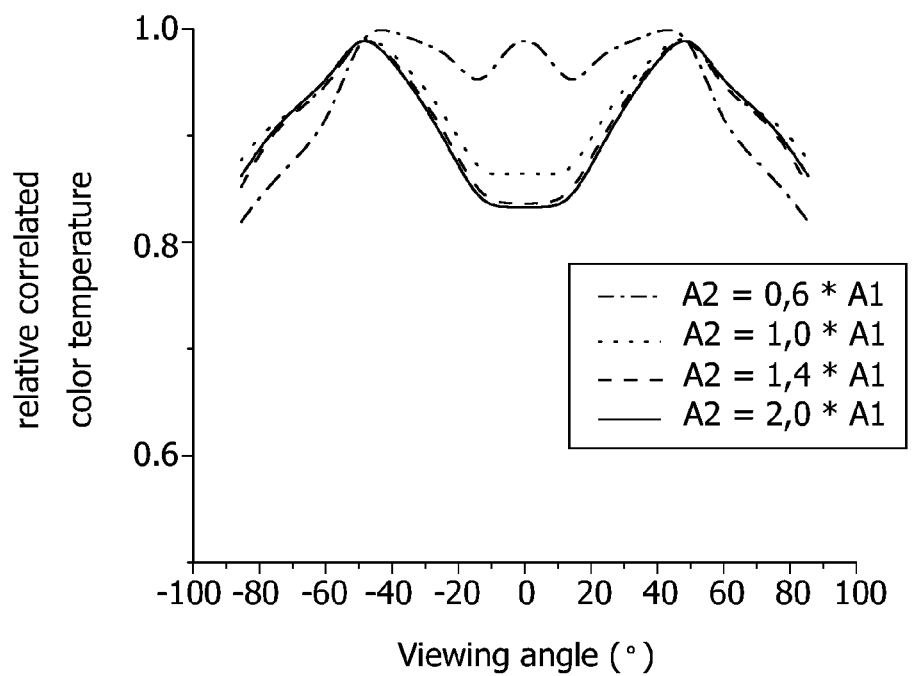
FIG. 4 shows the variation in the correlated color temperature as a function of the viewing angle for various first and second spacings in the case of an excess length equal to zero.

The effect of the first and second spacings 9a and 9b on the correlated color temperature as a function of the viewing angle 10 is shown in FIG. 4 by way of example for a disk-shaped light-converting element with an excess length 7 equal to zero and with an edge surface 3c parallel to the layer normal of the electroluminescent layer 21 (which corresponds here to the emission direction 5). In the legend of FIG. 4, the first spacing is denoted A1 and the second spacing is denoted A2. In the case of a second spacing 9b in the outer region 34 of the light-converting element 3 of 60% of the first spacing 9a in the inner region 33 of the light-converting element 3, a fluctuating color temperature as a function of the viewing angle 10 is obtained, which has a largely homogeneous correlated color temperature for viewing angles of between −50° and +50° relative to the mean emission direction 5. For viewing angles 10 greater than |50°|, there is an increase in the proportion of primary radiation in the mixed light and thus an increase in the difference in color temperature relative to the values in the case of small viewing angles. While the curves of the color temperature for viewing angles greater than |60°| essentially do not depend on the second spacing 9b in the region 34 (since the light-converting element has an excess length of zero), the proportion of secondary radiation in the angle range 20° to 50° and −20° to −50° increases as the second spacing increases relative to small viewing angles 10.

Figure 5:
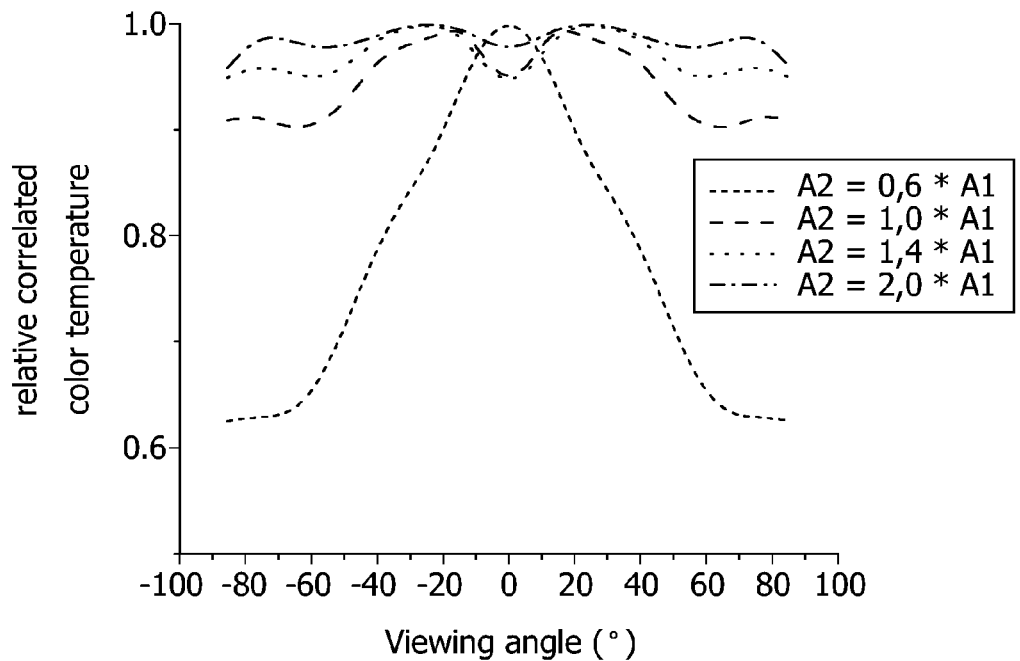
FIG. 5 shows the variation in the correlated color temperature as a function of the viewing angle for various first and second spacings in the case of an excess length equal to the distance between the first surface of the light-converting element and the electroluminescent layer.

FIG. 5 shows the curve of the correlated color temperature as a function of the viewing angle for the same ratios of the first and second spacings as in FIG. 4 by way of example for a disk-shaped light-converting element with an excess length 7 equal to the distance 8 between the first surface 3a of the light-converting element 3 and the electroluminescent layer 21 and with an edge surface 3c parallel to the layer normal of the electroluminescent layer 21 (which corresponds here to the emission direction 5). In the legend of FIG. 5, the first spacing is denoted A1 and the second spacing is denoted A2. In the case of a second spacing 9b in the outer region 34 of the light-converting element 3 of 60% of the first spacing 9a in the inner region 33 of the light-converting element 3, FIG. 5 shows a color temperature with a proportion of primary radiation in the mixed light which increases with the viewing angle 10. The greater the second spacing 9b in the outer region 34, the more homogeneous the correlated color temperature over the viewing angle 10. In the case of a second spacing 9b which is twice as large as the first spacing 9a, a color temperature which is largely independent of the viewing angle 10 is obtained. The position of the color point (which corresponds to the ratio of primary to secondary radiation) must in this case be adapted to the desired value via the absolute values of the first and second spacings 9a and 9b. Here, the proportion of primary radiation in the mixed light can be reduced locally for large second spacings 9b until it is completely converted into secondary radiation. By virtue of suitable structuring of the light-converting element 3, it is possible to produce other local regions with a high and low proportion of primary radiation in the mixed light.

At the given first and second spacings 9a and 9b, the correlated color temperatures also depend on the excess length, as can be seen from a comparison of FIGS. 4 and 5.

These parameters with the described effects are also to be used for other, non-sheet-like geometric embodiments of the light-converting element 3, with the corresponding adaptations.

For other exemplary embodiments with as low as possible a variation in the correlated color temperature over all viewing angles 10, care should be taken to ensure that the light path of the non-converted primary radiation, which depending on the emission characteristic of the electroluminescent light source 2 passes through the outer region 34 of the light-converting element 3 at large angles, is more or less the same as the light path in the inner region 33 of the light-converting element 3 with a corresponding propagation direction. Very homogeneous correlated color temperatures over all viewing angles 10 can be achieved for example with an electroluminescent device 1 in which a light-converting element 3 has an excess length $U_{LKE}$ 7 of more than the distance between the electroluminescent layer 21 and the first surface 3a of the light-converting element 3. The angle 12 of the edge surface 3c is between 20° and 70° in order to improve the homogeneity of the correlated color temperature. The second spacing 9b of the outer region 34 is between 60% and 100% greater than the first spacing 9a of the inner region 33 of the light-converting element 3. The average spacing (or average element thickness) is in this case between 50 μm and 500 μm for a transmittance of the ceramic light-converting material of greater than 40%. A high transmittance reduces the likelihood of scattering for primary radiation which enters the light-converting element 3 at a large angle and thus increases the proportion of primary radiation for large viewing angles 10. In addition, the so-called package gain of an electroluminescent device 1 increases with the transmittance of the light-converting element 3.

Figure 6:
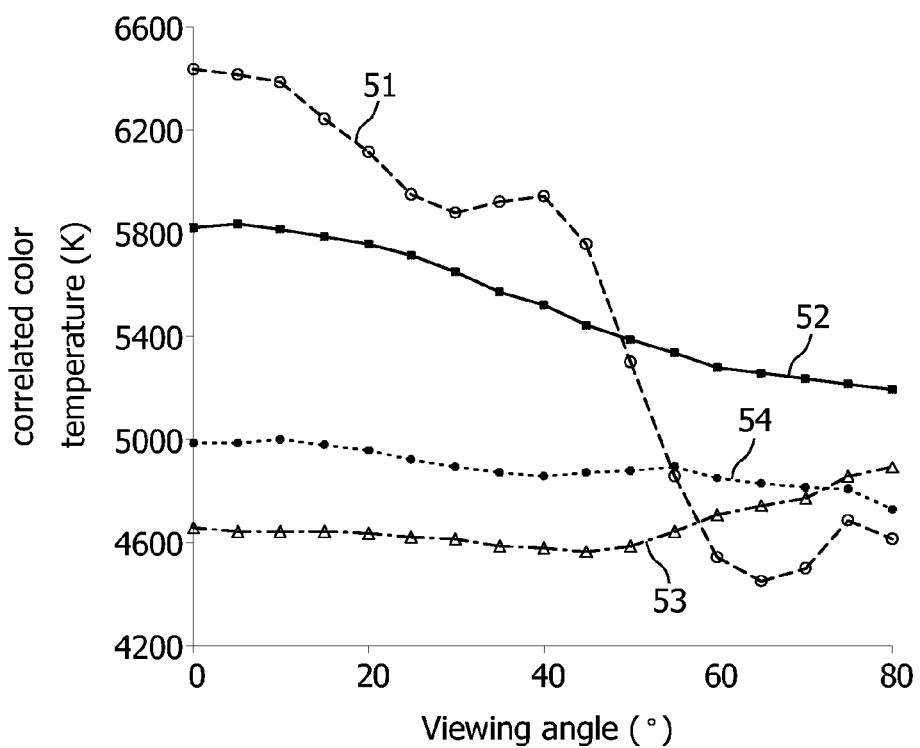
FIG. 6 shows a comparison of variations in the correlated color temperature as a function of the viewing angle for electroluminescent devices according to the invention as shown in FIG. 3.

FIG. 6 shows the correlated color temperature of two white-light-emitting electroluminescent devices 1 according to the invention with blue primary radiation and a Ce-doped YAG ceramic for producing yellow secondary radiation as a function of the viewing angle 10. For comparison purposes, corresponding data are shown for a conventional powder phosphor layer and a phosphor powder film. The data shown in FIG. 6 were calculated from emission spectra which were measured on the pcLEDs by means of an Autronic DMS 401 measuring device from Melchers GmbH. The measurement area is in each case greater than the emission area of the pcLED.

The data of the two electroluminescent devices according to the invention were measured on pcLEDs with different light-converting elements 3 which protrude beyond the electroluminescent light source by different amounts. The electroluminescent light source in each case has a surface area of 2×2 mm². The curve 51 in FIG. 6 was determined for an electroluminescent light source with a light-converting element composed of a matrix material with light-converting particles embedded therein, said light-converting element enclosing the electroluminescent light source in a dome-shaped manner. The correlated color temperature varies here by more than 2000 K as a function of the viewing angle 10. The curve 52 shows a smaller variation in the correlated color temperature of 800 K and was measured on an electroluminescent light source in which the covering particle layer produced by electrophoresis has a constant thickness. The curves 53 and 54 correspond to the values for two electroluminescent devices 1 according to the invention with light-converting elements 3 having the abovementioned shape parameters, which vary by less than 300 K over all the viewing angles. The slight increase and slight decrease, respectively, in the correlated color temperature for large viewing angles >60° can be further reduced by adapting the element thickness in the outer region 34. With a shape of the light-converting element 3 which is adapted according to the invention to the emission characteristic of the electroluminescent light source 2, it is possible to provide for example an electroluminescent device 1 for emitting mixed light of which the correlated color temperatures are almost independent of the viewing angle 10. The average thickness of the light-converting element is 450 μm. The excess length is five times the distance between the electroluminescent layer 21 and the light-converting element 3, and the edge surface 3c is arranged at an angle of 45° to the layer normal of the electroluminescent layer 21. The difference between the first and second spacings 9a and 9b is 200 μm.

The measured values shown in FIG. 6 were measured on electroluminescent light sources which had no lens 6 or optical element around the electroluminescent light source and the light-converting element 3. Despite this, the efficiency of the embodiments according to the invention is greater than that of conventional pcLEDs.

In another embodiment of the electroluminescent device 1 according to the invention, a light-converting element 3 according to the invention which is optically connected to the electroluminescent light source 2 has, on at least one surface from the group consisting of first surface 3a, second surface 3b and edge surface 3c, a refractive structure for improving the coupling of light from the electroluminescent light source 2 out of the light-converting element 3 and/or for the improved coupling of light into the light-converting element 3. In one embodiment, a light-converting element 3 according to the invention may comprise both a refractive structure for improving the coupling-in of light and a refractive structure for improving the coupling-out of light. These structures may be incorporated in the material of the light-converting element or be applied as an additional layer to the light-converting element, for example by means of an adhesion layer. By way of example, the refractive structures may be designed as a regular pattern of pyramids, domes or structures shaped in some other way.

The material of the light-converting element may consist of organic fluorescent substances, such as for example Lumogens from BASF, which are based mainly on perylene dyes embedded in a carrier material such as PMMA. Highly efficient transparent light-converting elements are obtained which cover the color space from yellow via orange, red, blue and green. Typically, use is made of inorganic powder fluorescent substances which can be applied by means of conventional deposition techniques. On the one hand, the powder fluorescent substances are embedded in a typically organic matrix material such as PMMA for example. This material may be processed as a layer or as a plate. On the other hand, these powder fluorescent substances may also be processed to form a polycrystalline ceramic. In this case, the density of the ceramic depends on the process parameters. For light-converting elements with a high transmittance, a density of such a ceramic of more than 97% of the theoretical solid density is required.

Depending on the field of application and the desired resulting mixed color, light-converting elements comprising inorganic powder fluorescent substances consist of at least one material from the groups

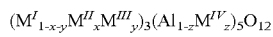

where $M^I$=(Y, Lu); $M^{II}$=(Gd, La, Yb); $M^{III}$=(Tb, Pr, Ce, Er, Nd, Eu) and $M^{IV}$=(Gd, Sc) for $0 \leq x \leq 1$; $0 \leq y \leq 0.1$ and $0 \leq z \leq 1$

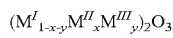

where $M^I$=(Y, Lu); $M^{II}$=(Gd, La, Yb) and $M^{III}$=(Tb, Pr, Ce, Er, Nd, Eu, Bi, Sb) for $0 \leq x \leq 1$ and $0 \leq y \leq 0.1$,

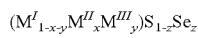

where $M^I$=(Ca, Sr, Mg, Ba); $M^{II}$=(Ce, Eu, Mn, Tb, Sm, Pr, Sb, Sn) and $M^{III}$=(K, Na, Li, Pb, Zn) for $0 \leq x \leq 0.01$; $0 \leq y \leq 0.05$ and $0 \leq z \leq 1$

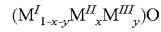

where $M^I$=(Ca, Sr, Mg, Ba); $M^{II}$=(Ce, Eu, Mn, Tb, Sm, Pr) and $M^{III}$=(K, Na, Li, Pb, Zn) for $0 \leq x \leq 0.1$ and $0 \leq y \leq 0.1$

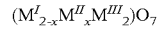

where $M^I$=(La, Y, Gd, Lu, Ba, Sr); $M^{II}$=(Eu, Tb, Pr, Ce, Nd, Sm; Tm) and $M^{III}$=(Hf, Zr, Ti, Ta, Nb) for $0 \leq x \leq 1$,

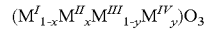

where $M^I$=(Ba, Sr, Ca, La, Y, Gd, Lu); $M^{II}$=(Eu, Tb, Pr, Ce, Nd, Sm, Tm); $M^{III}$=(Hf, Zr, Ti, Ta, Nb) and $M^{IV}$=(Al, Ga, Sc, Si) for $0 \leq x \leq 0.1$ and $0 \leq y \leq 0.1$

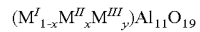

where $M^I$=(La, Y, Gd, Lu, Sc, Ba, Sr, Ca); $M^{II}$=(Eu, Tb, Pr, Ce, Nd, Sm, Tm) and $M^{III}$=(Mg, Al, Zn, Sc, B, Ga, Mn) for $0 \leq x \leq 1$ and $0 \leq y \leq 1$ and

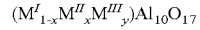

where $M^I$=(Ba, Sr, Ca); $M^{II}$=(Eu, Tb, Pr, Ce, Nd, Sm, Tm, Mn) and $M^{III}$=(Mg, Al, Zn, Sc, B, Ga) for $0 \leq x \leq 1$ and $0 \leq y \leq 1$.

Here the notation such as, for example, $M^I$=(Ca, Sr, Mg, Ba) for $M^I$ is intended to mean not just the individual elements but also mixtures of the elements in brackets.

The average wavelength of the primary radiation preferably lies in a wavelength range between 200 nm and 490 nm, so that all the other spectral regions required for producing white light by mixing primary radiation and secondary radiation are to be excited. In the case of a blue primary radiation, the secondary radiation therefore preferably comprises light in the yellow or green and red spectral region, whereby white light can be produced by means of color mixing.

In a further embodiment of a light-converting element according to the invention, a dimensionally stable matrix material comprises light-converting particles with different diameters, wherein the average diameter may differ locally. The ratio between absorption and scattering depends on the particle size and can be adjusted via the number and concentration of the first and second light-converting particles. The transmission and absorption behavior of the phosphor layer is determined by the so-called scattering power, the product of scattering coefficient and layer thickness, and the absorption coefficient. While the absorption coefficient is a material constant (e.g. is determined by the activator properties and concentration), the scattering coefficient for diameters in the μm range is inversely proportional to the average particle diameter. Given the same proportion of primary and secondary radiation in the light emitted by the electroluminescent device, increasing scattering in the light-converting element (produced for example by a decreasing particle diameter) has the effect that less primary radiation leaves the electroluminescent device in its original emission direction.

The embodiments explained with reference to the figures and the description are merely examples for reducing the variation in the correlated color temperature as a function of the viewing angle of an electroluminescent device, and are not to be understood as restricting the patent claims to these examples. Alternative embodiments are also possible for the person skilled in the art, and these alternative embodiments are likewise covered by the scope of protection of the patent claims. The numbering of the dependent claims is not intended to imply that other combinations of the claims do not also represent advantageous embodiments of the invention.

The invention claimed is:

1. An electroluminescent device comprising:
    at least one electroluminescent light source with an electroluminescent layer for emitting a primary radiation with an emission characteristic around a mean emission direction, and
    at least one light-converting element for converting at least part of the primary radiation into a secondary radiation, the at least one light-converting element having first, second and edge surfaces, a first spacing and a second larger spacing between the first and second surfaces, the first spacing is in a center of the at least one light-converting element and the second spacing is around its perimeter,
    wherein a shape of the second and edge surfaces of the light-converting element is adapted to the emission characteristic of the electroluminescent light source so as to generate a defined correlated color temperature as a function of a viewing angle,
    wherein the first surface faces toward the electroluminescent light source, the second surface faces away from the electroluminescent light source, and the edge surface is arranged between the first and second surface, and
    wherein the edge surface is arranged at an acute angle to a plane normal of the electroluminescent layer of the electroluminescent light source.

2. The electroluminescent device as claimed in claim 1, wherein the light-converting element is optically connected to the electroluminescent light source.

3. The electroluminescent device as claimed in claim 1, wherein the light-converting element comprises a material selected from at least one of ceramic and a dimensionally stable matrix material with embedded light-converting particles.

4. The electroluminescent device as claimed in claim 3, wherein the ceramic material has a density greater than 97% of the theoretical solid density.

5. The electroluminescent device as claimed in claim 3, wherein the light-converting element reflects less than 20% of the primary radiation.

6. The electroluminescent device as claimed in claim 1, wherein the shape of the light-converting element is selected from the group consisting of sheet-like shapes, disk-like shapes, bowl-like shapes.

7. The electroluminescent device as claimed in claim 6, wherein the light-converting element protrudes beyond the electroluminescent layer by an excess length $U_{LKE}$ parallel to the electroluminescent layer of the electroluminescent light source.

8. The electroluminescent device as claimed in claim 1, wherein the acute angle is between 20° and 70°.

9. The electroluminescent device as claimed in claim 1, wherein at least one surface from the group consisting of first surface, second surface and edge surface has a refractive structure.

10. An electroluminescent device comprising:
    at least one electroluminescent light source with an electroluminescent layer for emitting a primary radiation with an emission characteristic around a mean emission direction, and
    at least one light-converting element for converting at least part of the primary radiation into a secondary radiation, the at least one light-converting element having first, second and edge surfaces, a first spacing and a second larger spacing between the first and second surfaces, the first spacing is in a center of the at least one light-converting element and the second spacing is around its perimeter,
    wherein the electroluminescent layer protrudes beyond the light-converting element by an excess length $U_{EL}$ parallel to the first surface of the light-converting element.

11. An electroluminescent device comprising:
    at least one electroluminescent light source with an electroluminescent layer for emitting a primary radiation with an emission characteristic around a mean emission direction, and
    at least one light-converting element for converting at least part of the primary radiation into a secondary radiation, the at least one light-converting element having first, second and edge surfaces, a first spacing and a second larger spacing between the first and second surfaces, the first spacing is in a center of the at least one light-converting element and the second spacing is around its perimeter,
    wherein a shape of the second and edge surfaces of the light-converting element is adapted to the emission characteristic of the electroluminescent light source so as to generate a defined correlated color temperature as a function of a viewing angle,
    wherein the light-converting element protrudes beyond the electroluminescent layer by an excess length $U_{LKE}$ parallel to the electroluminescent layer of the electroluminescent light source, and
    wherein the excess length $U_{LKE}$ is equal to or greater than the distance between the electroluminescent layer and the first surface of the light-converting element.

12. An electroluminescent device comprising:
    at least one electroluminescent light source with an electroluminescent layer for emitting a primary radiation with an emission characteristic around a mean emission direction, and
    at least one light-converting element for converting at least part of the primary radiation into a secondary radiation, the at least one light-converting element having first, second and edge surfaces, a first spacing and a second larger spacing between the first and second surfaces, the first spacing is in a center of the at least one light-converting element and the second spacing is around its perimeter,
    wherein a shape of the second and edge surfaces of the light-converting element is adapted to the emission characteristic of the electroluminescent light source so as to generate a defined correlated color temperature as a function of a viewing angle,
    wherein the first surface faces toward the electroluminescent light source, the second surface faces away from the electroluminescent light source, and the edge surface is arranged between the first and second surface, and
    wherein the second spacing is less than or equal to four times the first spacing.

13. A method for producing an electroluminescent device having at least one electroluminescent light source with an electroluminescent layer for emitting a primary radiation with an emission characteristic around a mean emission direction, the method comprising acts of:
    providing at least one light-converting element for converting at least part of the primary radiation into a secondary radiation, the at least one light-converting element having first, second and edge surfaces, a first spacing and a second larger spacing between the first and second surfaces, the first spacing is in a center of the at least one light-converting element and the second spacing is around its perimeter, wherein the first surface faces toward the electroluminescent light source, the second surface faces away from the electroluminescent light source, the edge surface is arranged between the first and second surface and is arranged at an acute angle to a plane normal of the first surface, defining a desired correlated color temperature as a function of a viewing angle, and adapting a shape of the second and edge surfaces of the light-converting element to the emission characteristic of the electroluminescent light source so as to generate a defined correlated color temperature as a function of the viewing angle.

14. An electroluminescent device comprising:

at least one electroluminescent light source with an electroluminescent layer for emitting a primary radiation with an emission characteristic around a mean emission direction, and at least one light-converting element for converting at least part of the primary radiation into a secondary radiation, the at least one light-converting element having first, second and edge surfaces, a first spacing and a second larger spacing between the first and second surfaces, the first spacing is in a center of the at least one light-converting element and the second spacing is around its perimeter, wherein the first surface faces toward the electroluminescent light source, the second surface faces away from the electroluminescent light source, the edge surface is arranged between the first and second surface, wherein the second spacing extends beyond the first spacing in a direction away from the electroluminescent light source, and wherein a shape of the second and edge surfaces of the light-converting element is adapted to the emission characteristic of the electroluminescent light source so as to generate a defined correlated color temperature as a function of a viewing angle.

* * * * *